(12) United States Patent
Uehira et al.

(10) Patent No.: US 9,250,515 B2
(45) Date of Patent: Feb. 2, 2016

(54) ELECTROPHOTOGRAPHIC PHOTORECEPTOR AND COPYING MACHINE USING SAME, AND DOPE FOR FORMING PHOTOSENSITIVE LAYER OF SAME

(71) Applicant: FUJIFILM Corporation, Minato-ku, Tokyo (JP)

(72) Inventors: Shigeki Uehira, Ashigarakami-gun (JP); Toshihide Yoshitani, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 111 days.

(21) Appl. No.: 14/245,596

(22) Filed: Apr. 4, 2014

(65) Prior Publication Data

US 2014/0220484 A1 Aug. 7, 2014

Related U.S. Application Data

(63) Continuation of application No. PCT/JP2012/075449, filed on Oct. 2, 2012.

(30) Foreign Application Priority Data

Oct. 7, 2011 (JP) .................................. 2011-222578

(51) Int. Cl.
 *G03G 5/04* (2006.01)
 *G03F 5/04* (2006.01)
 *C08G 63/193* (2006.01)
 *G03G 5/05* (2006.01)
 *G03G 15/00* (2006.01)

(52) U.S. Cl.
 CPC ................ *G03F 5/04* (2013.01); *C08G 63/193* (2013.01); *G03G 5/04* (2013.01); *G03G 5/056* (2013.01); *G03G 5/0589* (2013.01); *G03G 15/75* (2013.01); *G03G 2215/00957* (2013.01)

(58) Field of Classification Search
 CPC ......... G03G 5/04; G03G 15/75; G03G 5/056; G03G 5/0589
 See application file for complete search history.

(56) References Cited

U.S. PATENT DOCUMENTS

2007/0243488 A1 10/2007 Tsunemori

FOREIGN PATENT DOCUMENTS

| JP | 08-234457 A | 9/1996 |
| JP | 2006-292929 A | 10/2006 |

OTHER PUBLICATIONS

International Search Report of PCT/JP2012/075449 dated Dec. 18, 2012, 6 pages in Japanese and English.
Written Opinion of the International Searching Authority of PCT/JP2012/075449 dated Dec. 18, 2012, 3 pages.
International Preliminary Report on Patentability and Written Opinion, mailed Apr. 8, 2014, issued in corresponding International Application No. PCT/JP2012/075449, 5 pages in English.

*Primary Examiner* — Stewart Fraser
(74) *Attorney, Agent, or Firm* — Sughrue Mion, PLLC

(57) ABSTRACT

In an electrophotographic photoreceptor having a photosensitive layer on a conductive support, a binder resin that constitutes the photosensitive layer includes a polymer containing a skeleton derived from dehydroabietic acid in the main chain. An electrophotographic photoreceptor which accelerates conversion to natural materials from the viewpoint of manufactured product quality or production suitability, since the binder resin of the photosensitive layer has satisfactory solvent solubility.

16 Claims, 3 Drawing Sheets

ELECTROPHOTOGRAPHIC PHOTORECEPTOR AND COPYING MACHINE USING SAME, AND DOPE FOR FORMING PHOTOSENSITIVE LAYER OF SAME

BACKGROUND OF THE INVENTION

1. Field of the Invention

The present invention relates to an electrophotographic photoreceptor and a copying machine using the same, and a dope for forming a photosensitive layer of the same.

2. Description of the Related Art

Copying machines and printers have been widely distributed mainly as office equipment, but regardless of home applications or business applications, and recently, the ranges of the equipment form and the use are further extending to areas such as compositization of a printer and a copying machine, or coping with the demand for high resolution printed matters. Among the components that constitute such copying machines and the like, a photoreceptor takes an important position and achieves a function of converting electronic information on its surface from a charged latent image to an actual image. Organic photoconductors (OPC's) that currently constitute the mainstream have their structural members formed from organic main bodies. On the other hand, the photoreceptors should meet the requirements of photoelectric conversion, which is a principal function, as well as mechanical strength. It is not easy for structural members formed from organic materials to achieve a balance between the two, and there is a demand for further technical development.

Among others, a photosensitive layer that is provided in an organic photoreceptor is an important part that is in charge of the photoelectric conversion by generating charges by means of a charge generating agent under exposure, and transporting these charges. On the other hand, the photosensitive layer is also a part that is subjected to impact, such as rotational contact with a drum that supplies toner, or with a cleaner, and is subjected to mechanical damage or fatigue. This is a part which causes significant changes in the performance of the photoreceptor depending on the material applied to the photosensitive layer, and also contributes to a large extent to the product service life, which is based on durability of the photosensitive layer.

It has been suggested to employ a particular polycarbonate as a material that is applied to the photosensitive layer (binder resin) (see JP1996-234457A(JP-H08-234457A) and JP2006-292929A). It is believed that the charging characteristics required in an electrophotographic photoreceptor can be improved thereby, or abrasion resistance and the like can be enhanced thereby.

SUMMARY OF THE INVENTION

However, the present applicant previously paid attention to compounds derived from dehydroahietic acid, which is a natural resource, and succeeded in producing a polymer thereof. Then, the applicant identified the properties of the polymer and found that the polymer can exhibit high heat resistance and resistance to moisture and water (JP2011-26569A and JP2011-74249A) Furthermore, the applicant also found, through subsequent research and development, that a film molded product having high transparency can be obtained using the polymer.

Substitution from petroleum-based resins to plant-based resins, aimed for a low carbon society, is underway in various fields. However, it has not been actively proposed heretofore to use a plant-derived raw material as a material for the electrophotographic photoreceptor. One of the reasons for this may be the presumption that general plant-derived raw materials do not have satisfactory heat resistance, and are not suitable for that application. Furthermore, regarding other properties, a resin material that is applicable to a photosensitive layer is also required to have compatibility with additives thereof (for example, a hole transporting agent and a charge generating agent), high film strength and the like, so that it is contemplated that one of the causes may be that active research for employment thereof has not been conducted.

The present inventors attempted to apply polymers of the natural materials that have been newly developed as materials of the photoreceptor, and looked for a possibility as genuine substitute materials that replace currently used synthetic resins.

That is, an object of the present invention is to provide an electrophotographic photoreceptor which has high environmental suitability (because a binder resin using a compound of plant origin is utilized as the material of a photosensitive layer), exhibits a performance comparable to that of currently used synthetic resins in view of the photoelectric conversion performance or durability (abrasion resistance), and accelerates in earnest substitution of an electrophotographic photoreceptor itself or members thereof in the related art; a copying machine using this electrophotographic photoreceptor; and a dope used in this electrophotographic photoreceptor. Furthermore, another object of the invention is to provide an electrophotographic photoreceptor which accelerates conversion to natural materials even from the viewpoint of manufactured product quality or production suitability due to good solvent solubility of the binder resin of the photosensitive layer, a copying machine using this electrophotographic photoreceptor, and a dope used in this electrophotographic photoreceptor.

The problems described above were solved by an electrophotographic photoreceptor, a copying machine, and a dope for forming a photosensitive layer of an electrophotographic photoreceptor described below.

The electrophotographic photoreceptor of the present invention is an electrophotographic photoreceptor having a photosensitive layer on a conductive support, while the binder resin that constitutes the photosensitive layer includes a polymer containing a skeleton derived from dehydroabietic acid in the main chain.

Preferably, the skeleton derived from dehydroabietic acid contains a structure represented by the following general formula (U).

[Chem. 1]

Formula (U)

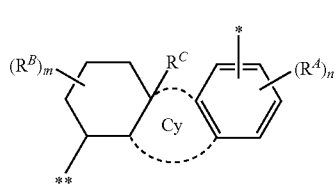

(wherein $R^A$ and $R^B$ each represent an alkyl group or alkenyl group having 1 to 6 carbon atoms; n and m each represent an integer of 0 to 3; $R^C$ represents a hydrogen atom or an alkyl group having 1 to 3 carbon atoms; ring Cy represents a saturated or unsaturated 6-membered ring or 7-membered ring which may contain a heteroatom; symbols * and ** in the formula represent single bond; and symbol * may be a single bond extending from $R^4$.)

Furthermore, preferably, the polymer includes a repeating unit represented by the following general formula A1 or A2.

[Chem. 2]

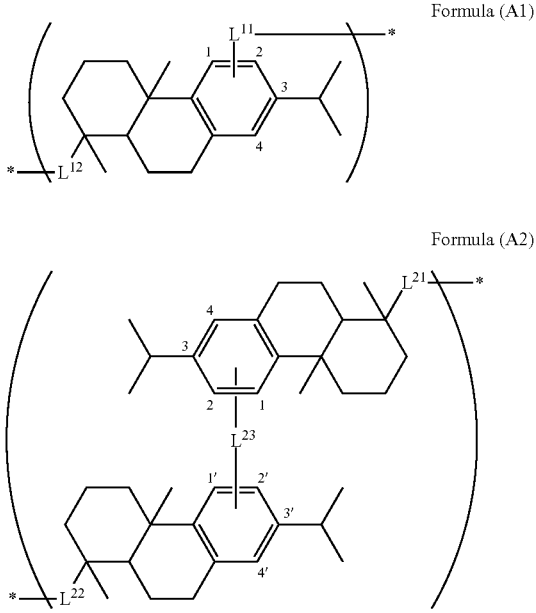

Formula (A1)

Formula (A2)

(wherein $L^{11}$, $L^{12}$, $L^{21}$, $L^{22}$ and $L^{23}$ each represent a divalent linking group; a symbol * represents a single bond.)

Furthermore, preferably, in general formula A1, $L^{11}$ is bonded to the carbon atom shown at the 2-position in the formula.

Furthermore, preferably, in general formula A2, $L^{23}$ is bonded to the carbon atoms shown at the 2-position and the 2'-position in the formula.

Furthermore, preferably, $L^{11}$ in formula A1 represents *-$L^{13}$-CO-** or *-CO-$L^{13}$-** (wherein * represents a single bond on the hydrophenanthrene ring side; and ** represents a single bond opposite to the foregoing single bond); $L^{13}$ represents at least one of an alkylene group, an alkenylene group, an alkynylene group, an arylene group, an oxygen atom, a carbonyl group, and a single bond; and $L^{12}$ represents a carbonyl group or a carbonyloxy group.

Furthermore, preferably, $L^{21}$ and $L^{22}$ in general formula A2 each represent a carbonyl group or a carbonyloxy group; and $L^{23}$ represents an oxygen atom, a sulfur atom, a carbonyl group, a sulfonyl group, an alkylene group, an alkenylene group, an arylene group, or a single bond.

Furthermore, preferably, the polymer further includes a repeating unit derived from a diol compound containing a ring structure.

Furthermore, preferably, the repeating unit derived from a diol compound containing a ring structure is represented by the following general formula B1:

[Chem. 3]

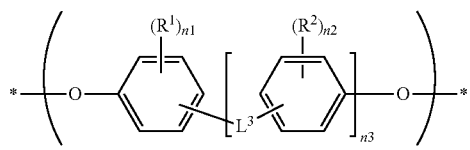

Formula (B1)

(wherein $L^3$ represents an oxygen atom, a carbonyl group, a sulfonyl group, an alkylene group, or a single bond; when there are available plural $L^3$'s, the respective $L^3$'s may be identical or different; $R^1$ and $R^2$ each independently represent a halogen atom, an alkyl group or an alkoxy group, and may also be bonded to each other and form a ring; when there are available plural $R^1$'s and $R^2$'s, the respective $R^1$'s and $R^2$'s may be identical or different; n1 and n2 each independently represent an integer of 0 to 4; n3 represents an integer of 0 to 2; and * represents a single bond.)

Furthermore, preferably, the degree of plant derivation of the binder resin is 25% by mass or more.

Furthermore, preferably, the conductive support is a cylindrically shaped transparent support, and includes a charge generating layer and a charge transporting layer as a photosensitive layer along the outer circumference.

Furthermore, preferably, the photosensitive layer contains a binder resin, and a charge generating agent or a charge transporting agent. The copying machine of the present invention includes the electrophotographic photoreceptor of the present invention.

The dope for forming a photosensitive layer of the electrophotographic photoreceptor of the present invention is a dope for forming a photosensitive layer that is provided on a conductive substrate in an electrophotographic photoreceptor, and a charge generating agent is incorporated into a binder resin containing a polymer having a skeleton derived from dehydroabietic acid in a repeating unit.

In regard to the electrophotographic photoreceptor of the present invention and a copying machine using this electrophotographic photoreceptor, since a binder resin using a compound of plant origin is utilized in the photosensitive layer of the electrophotographic photoreceptor, the electrophotographic photoreceptor has high environmental suitability and also exhibits a performance comparable to that of currently used synthetic resins in terms of photoelectric conversion performance or durability (abrasion resistance). Accordingly, substitution of an electrophotographic photoreceptor itself or members thereof in the related art can be accelerated in earnest.

Furthermore, since the binder resin of the photosensitive layer has satisfactory solvent solubility, even from the viewpoint of manufactured product quality or production suitability, conversion to natural materials can be accelerated.

Furthermore, in regard to the dope of the present invention, since the dope includes the above-described binder resin using a compound of plant origin, the dope is preferable from the viewpoint of environmental consideration, and since the dope exhibits the excellent performance described above, the dope is very useful as a raw material that forms a photosensitive layer of an electrophotographic photoreceptor.

DESCRIPTION OF THE PREFERRED EMBODIMENTS

The electrophotographic photoreceptor (hereinafter, also simply referred to as "photoreceptor") of the present invention has a photosensitive layer which uses a binder resin including a particular polymer using a compound of plant origin, as a constituent member. Thereby, satisfactory photoelectric conversion characteristics, and sufficient heat resistance and abrasion resistance have been realized. Although some unclarified matters are included, a reason for this is speculated as follows. That is, it is speculated to be because the particular polymer two-dimensionally links a dehydroabietic acid-derived tricyclic moiety that is stable in view of chemical structure, as a mother structure, and produces a characteristic matrix in the resin. There has been heretofore no example of employing such a material as a material for photoreceptors, and particularly, biomass polymers in the related art usually have inferior heat resistance.

The particular polymer used in the present invention exhibits sufficient heat resistance for the utilization in an electrophotographic photoreceptor, regardless of the fact that a compound of plant origin can be used as a raw material. What should be mentioned more specially is that the particular polymer forms a high-quality photosensitive layer having sufficient transparency, and exhibits a performance equal to or superior to that of a polycarbonate-based or polyphenol-based synthetic resin, which is considered to exhibit high performance at present in connection with the performance of a photoreceptor. Hereinafter, more detailed description will be given mainly based on preferred embodiments of the present invention.

[Electrophotographic Photoreceptor]

Figure 1:
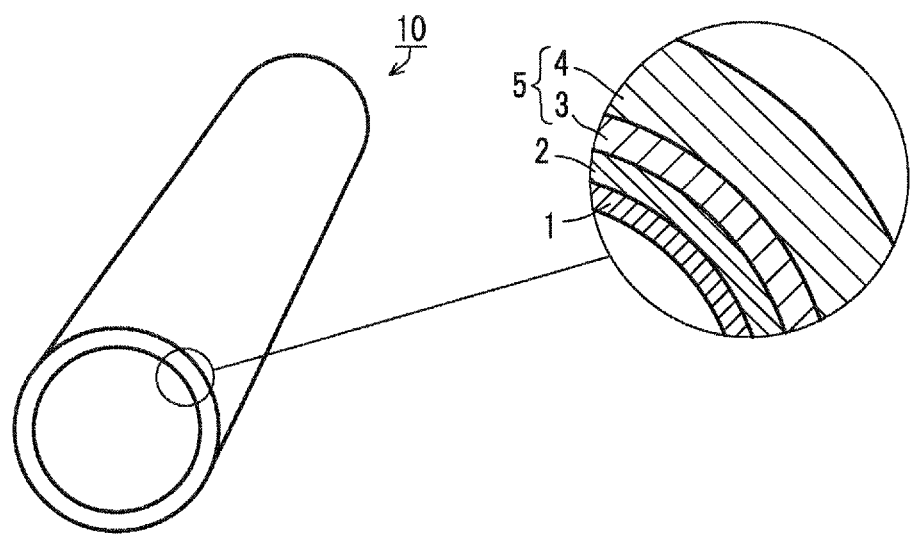
FIG. 1 is a cross-sectional diagram schematically illustrating an electrophotographic photoreceptor as an embodiment of the present invention.

The electrophotographic photoreceptor of the present invention may have a photosensitive layer on a conductive support, and there are no particular limitations on the particular structure. A preferred example of the embodiment may be an electrophotographic photoreceptor 10 illustrated in FIG. 1. In this photoreceptor, the conductive support 1 is a cylindrically shaped transparent support, and includes the photosensitive layer 5 which is composed of a charge generating layer 3 and a charge transporting layer 4 along the outer circumference. In this embodiment, an underlayer 2 is provided between the cylindrically shaped conductive support 1 and the charge generating layer 3. Furthermore, the charge generating layer 3 and the charge transporting layer 4 that constitute the photosensitive layer 5 respectively contain a charge generating layer (not shown in the diagram) or a charge transporting agent (not shown in the diagram).

In regard to the photoreceptor of the present invention, it is preferable that the binder resin that constitutes particularly the charge transporting layer in the photosensitive layer, contains a particular polymer that will be described below. Thereby, the noticeable operating effect of the present invention described above can be obtained.

The structure that is applied to the electrophotographic photoreceptor of the present invention may have a structure having a single layer photoconductive layer, or may be a structure of functionally separable laminate type. Recently, a laminate type electrophotographic photoreceptor composed of two layers, namely, a charge generating layer that generates charges under exposure and a charge transporting layer that transports charges, constitutes the mainstream. Furthermore, if necessary, in addition to the underlayer 2, a protective layer (not shown in the diagram), an adhesive layer (not shown in the diagram) and the like may also be provided.

The up-and-down direction in the photoreceptor is not particularly limited, but if necessary, the direction facing from the conductive support 1 to the photosensitive layer 5 is designated as "up", and the opposite direction is designated as "down".

[Particular Polymer]

(Repeating Unit Containing Skeleton Derived from Dehydroabietic Acid)

The particular polymer of the present invention that uses, as a raw material monomer, dehydroabietic acid represented by the following formula (AA) or a derivative thereof, may be a homopolymer obtainable by polymerizing the relevant raw material, or may be a copolymer obtainable by polymerizing the relevant raw material monomer and other monomers. That is, the particular polymer is formed to include a repeating unit containing a skeleton derived from dehydroabietic acid in the molecular structure

[Chem. 4]

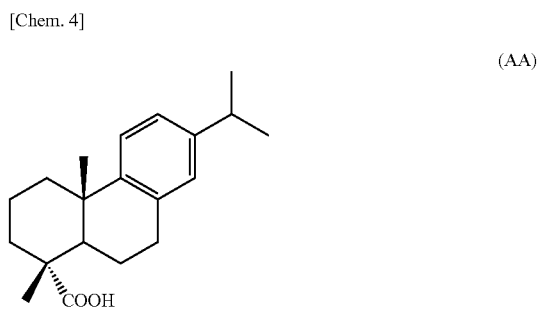

(AA)

Here, the "skeleton derived from dehydroabietic acid" as used in the present invention desirably has the structure derived from dehydroabietic acid described above, in other words, the skeleton may be a structural skeleton that can be derived from dehydroabietic acid to the extent that a desired effect is provided. However, it is essential that a tricyclic mother nucleus structure of dehydroabietic acid be retained (the number of atoms that constitute the rings may not be retained), and a benzene ring be included in as one of the rings. Preferred examples include the following.

[Chem. 5]

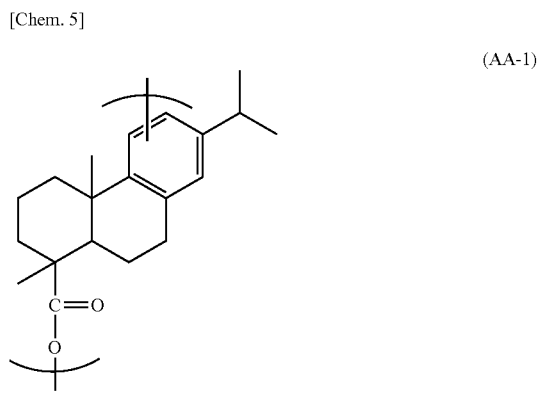

(AA-1)

(AA-2) 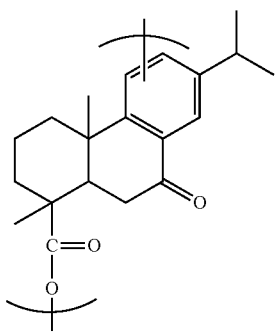

(AA-3) 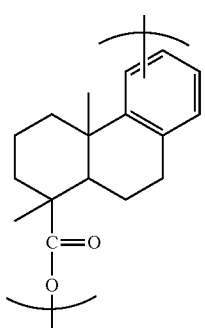

(AA-4) 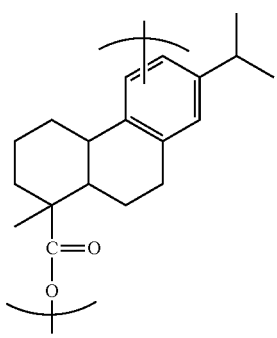

(AA-5) 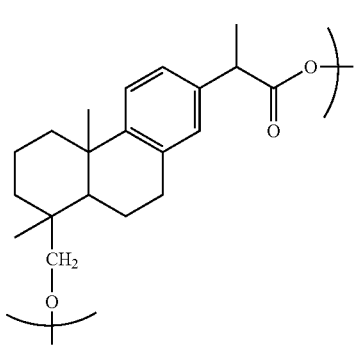

(AA-6) 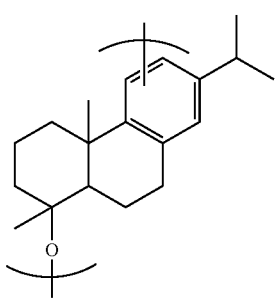

(AA-7) 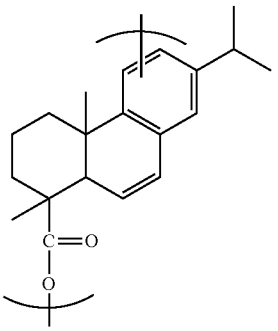

(AA-8) 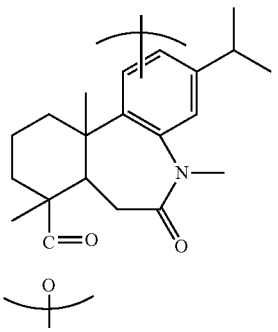

(AA-9) 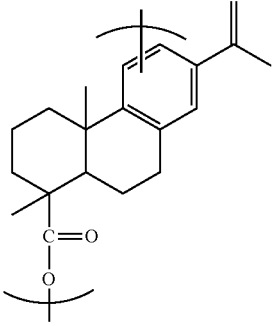

(AA-10) 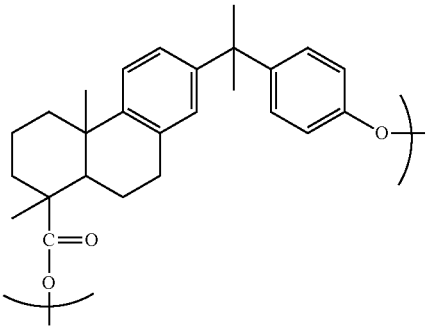

The "skeleton derived from dehydroabietic acid" may further have a substituent. Examples of the substituent that may be carried include an alkyl group, an alkoxy group, a halogen atom, a hydroxyl group, a carbonyl group, a nitro group, and an amino group.

Preferred examples include (AA-1), (AA-3), and (AA-10), and a most preferred example is (AA-1).

That is, when the skeleton derived from dehydroabietic acid that is included in the particular polymer of the present invention is generalized, it is preferable that the skeleton contain a structure represented by the following general formula (U):

[Chem. 6]

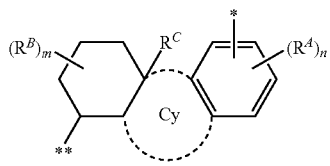

Formula (U)

$R^A$ and $R^B$ each represent an alkyl group or alkenyl group having 1 to 6 carbon atoms. n and m each represent 0 to 3. $R^C$ represents a hydrogen atom or an alkyl group having 1 to 3 carbon atoms. Ring Cy represents a saturated or unsaturated 6-membered ring or 7-membered ring, which may be contain a heteroatom. In the formula, symbols * and ** each represent a single bond. Symbol * may be a single bond extending from $R^A$. $R^B$ is preferably a methyl group. $R^A$ is preferably an alkyl group having 1 to 4 carbon atoms, and more preferably an i-propyl group. Cy is preferably a cyclohexane ring or a cyclohexene ring, and more preferably a cyclohexane ring. n and m are each preferably 1.

The above general formula (U) is preferably the following general formula (U1):

[Chem. 7]

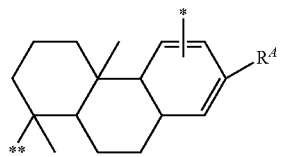

Formula (U1)

wherein symbols * and ** each represent a single bond; and $R^A$ has the same meaning as $R^A$ in general formula (U).

Dehydroabietic acid is one component that constitutes rosin that is included in pine resin of plant origin, and is a material originating from a biomass resource, which is an environmentally suitable type preferable as a next-generation material. Since the present invention utilizes this material originating from a biomass resource (material of natural origin) as a substrate, the amount of carbon dioxide emission is cancelled, and thus the normalized amount of emission can be reduced to a large extent compared with plastic materials of fossil fuel origin. Furthermore, the skeleton derived from dehydroabietic acid, and the skeleton represented by formula (U) or (U1) may be collectively referred to as a dehydroabietane main skeleton, and this may be abbreviated to a "DA main skeleton".

Furthermore, examples of important skeletal structures for the preferred embodiment of the present invention include skeletons represented by the following formulae (U2) and (U3). A skeleton of the following formula (U2) is referred to as a dehydroabietane skeleton (DA skeleton), and a skeleton of the formula (U3) is referred to as a dehydroabietic acid skeleton (DAA skeleton).

[Chem. 8]

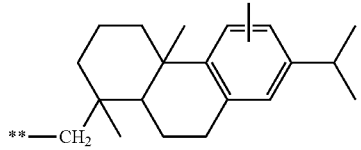

Formula (U2)

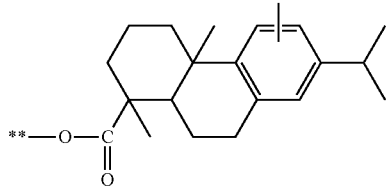

Formula (U3)

The particular polymer preferably includes repeating units represented by the following general formula A1 and/or general formula A2:

[Chem. 9]

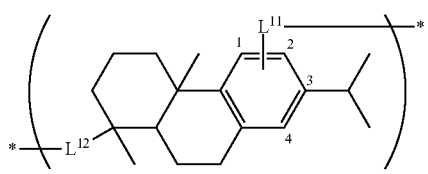

Formula (A1)

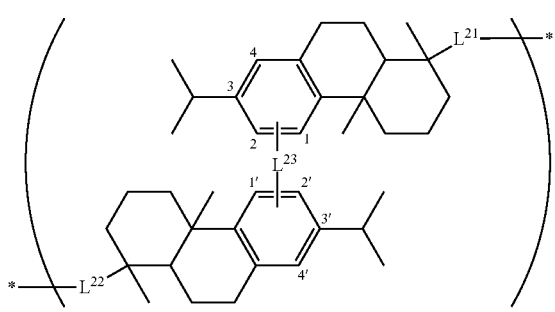

Formula (A2)

(wherein $L^{11}$, $L^{12}$, $L^{21}$, $L^{22}$ and $L^{23}$ each represent a divalent linking group; and * represents a single bond.)

In the general formula (A1), it is preferable that $L^{11}$ be bonded to the carbon atom shown at the 2-position in the formula. In the general formula (A2), it is preferable that $L^{23}$ be bonded to the carbon atom shown at the 2-position and the 2'-position in the formula.

(Molecular Weight and the Like)

The particular polymer according to the present invention is that as long as the particular polymer contains the DA main skeleton so as to constitute a portion of the main chain, the form of bonding is not particularly limited. Although the weight average molecular weight of the particular polymer is not limited, the weight average molecular weight is preferably 5,000 to 700,000, and more preferably 10,000 to 500,000. When the weight average molecular weight is in this range, moldability, strength and the like as an electrophotographic photoreceptor material are improved. The weight average molecular weight according to the present invention is a value obtained by molecular weight measurement (relative to polystyrene standards) by gel permeation chromatography (GPC). In the present specification, unless particularly stated otherwise, the molecular weight is indicated as a value obtained using N-methyl-2-pyrrolidone as a carrier, and TSK-gel Super AWM-H (trade name) manufactured by Tosoh Corp. as a column.

The glass transition temperature (Tg) is not limited, but is preferably 60° C. or higher, more preferably 80° C. to 400° C., and even more preferably 100° C. to 350° C. When the glass transition temperature is in this range, the particular polymer has particularly excellent heat resistance, and can be suitably used in electrophotographic photoreceptor materials and the like. The glass transition temperature is measured using a differential scanning calorimeter over a predetermined temperature range under a nitrogen gas stream under the conditions of a rate of temperature increase of 10° C./min. In the present specification, unless particularly stated otherwise, the glass transition temperature means a value measured using trade name: X-DSC7000 manufactured by SII Technology, Inc. More specific matters will be described in the section of Examples that will be described below.

The density of the particular polymer is not limited, but is preferably 1.25 g/cm$^3$ or less, more preferably 0.90 g/cm$^3$ to 1.25 g/cm$^3$, and even more preferably 1.00 g/cm$^3$ to 1.20 g/cm$^3$. When the density is in this range, the particular polymer has excellent heat resistance, moldability and the like, and furthermore, moisture resistance and water resistance, and transparency are realized. Thus, the particular polymer is satisfactorily used in an electrophotographic photoreceptor material or the like. The density of the particular polymer means a value measured using a precision specific gravity meter (manufactured by Shimadzu Corp., trade name: Precision Specific Gravity Meter AUW120D).

The particular polymer also includes derivatives obtained by further subjecting the particular polymer having a repeating unit containing the DA main skeleton to a chemical treatment or the like.

The total percentage content of the repeating unit containing the DA main skeleton that constitutes the particular polymer is not particularly limited, but from the viewpoint of the degree of plant derivation and density, the total percentage content is preferably 10 mol % or more, more preferably 20 mol % or more, even more preferably 30 mol % or more, and still more preferably 40 mol % or more, relative to the total amount of the structural moiety that constitutes the repeating unit (for example, when the total amount of the repeating unit derived from a dicarboxylic acid compound of the following polyester-based polymer is 50 mol %).

When the repeating unit containing the DA main skeleton is used as a component of natural origin, the percentage content of the component of natural origin is not particularly limited, but from the viewpoint of environmental consideration, the percentage content on a mass basis is preferably 25% by mass or more, more preferably 40% by mass or more, and particularly preferably 50% by mass or more, relative to the total amount of the resin component that is applied to the photosensitive layer. There is no particularly defined upper limit, but when impurities and the like are also considered, the upper limit is practically about 98% by mass or less.

<Ratio of Component of Natural Origin (Degree of Plant Derivation): Rn>

$Rn(\%) = Wn/Wt \times 100$

Wt: total mass of resin components
Wn: total mass of the DA main skeleton component (calculated value obtained from the feed amount of the DA main skeleton)

The particular polymer may also be a copolymer containing at least one kind of other repeating unit that does not contain the DA main skeleton, as necessary.

(Form of Linkage)

In the general formulae (A1) and (A2), there are five linking groups of $L^{11}$, $L^{12}$, $L^{21}$, $L^{22}$ and $L^{23}$, but in regard to the four linking groups other than $L^{23}$, the preferred linking groups are different respectively for the two kinds of (1) polyester-based polymer [I] and (2) the polyester-based polymer [II]. Among them, in the present invention, from the viewpoint that high performance is obtained, the (1) polyester-based polymer [I] is preferred, and preferred linking groups will be described in order in the following. The polyester according to the present specification may have an oxycarbonyl group as a linking group, and may also take a carbonate structure.

(1) Polyester-Based Polymer [I]

<Repeating Unit Derived from Dicarboxylic Acid Compound>

~Repeating Unit Represented by General Formula A1~

$L^{11}$ $L^{11}$ in the general formula (A1) is preferably *-$L^{13}$-CO-** or *-CO-$L^{13}$-**. Symbol * represents a single bond on the side of a 5,6,7,8,9,10-hexahydrophenanthrene ring (mother nucleus) (hereinafter, also simply referred to as "hydrophenanthrene ring"). Symbol ** represents a single bond opposite to the single bond represented by symbol *. $L^{13}$ is preferably an alkylene group, an alkenylene group, an alkynylene group, an arylene group, an oxygen atom, a carbonyl group, a single bond, or a combination thereof. Even more preferably, $L^{11}$ is *-CO-** or *-COO-**.

According to the present specification, the term "linking group" is used to mean that as long as linkage of two structural moieties are concerned, the linking group includes an atom or a single bond.

The alkylene group and alkenylene group may be each a linear or a branched chain, or may be cyclic. From the viewpoint of the convenience of synthesis, $L^{13}$ is preferably an alkylene group having 2 to 10 carbon atoms, an alkenylene group having 2 to 10 carbon atoms, an arylene group having 6 to 18 carbon atoms, an oxygen atom, or a single bond. $L^{13}$ is more preferably a chain-like alkylene group having 2 to 4 carbon atoms, a cyclic alkylene group having 5 to 6 carbon atoms, a chain-like alkenylene group having 2 to 4 carbon atoms, a cyclic alkenylene group having 5 to 6 carbon atoms, an arylene group having 6 to 10 carbon atoms, an oxygen atom, or a single bond.

When the term "compound" is attached as an ending of a word to refer to a particular molecule in the present specification, the term is used to mean the relevant compound itself, as well as a salt, a complex and an ion thereof. Furthermore, to the extent of providing a desired effect, the compound means to include derivatives having a predetermined substituent or modified to predetermined forms. Furthermore, when the term "group" is attached as an end of a word to refer to a particular atomic group in connection to a substituent or a linking group in the present specification, the group means that the relevant group may have an arbitrary substituent. An example of the substituent that may be further carried by a linking group may be the following substituent T.

The substituent T is an alkyl group (preferably, an alkyl group having 1 to 20 carbon atoms, for example, methyl, ethyl, isopropyl, t-butyl, pentyl, heptyl, 1-ethylpentyl, benzyl, 2-ethoxyethyl, or 1-carboxymethyl), an alkenyl group (preferably, an alkenyl group having 2 to 20 carbon atoms, for example, vinyl, allyl, or oleyl), an alkynyl group (preferably, an alkynyl group having 2 to 20 carbon atoms, for example, ethynyl, butadiynyl, or phenylethynyl), a cycloalkyl group (preferably, a cycloalkyl group having 3 to 20 carbon atoms, for example, cyclopropyl, cyclopentyl, cyclohexyl, or 4-methylcyclohexyl), an aryl group (preferably, an aryl group having 6 to 26 carbon atoms, for example, phenyl, 1-naphthyl, 4-methoxyphenyl, 2-chlorophenyl, or 3-methylphenyl), a heterocyclic group (preferably, a heterocyclic group having 2 to 20 carbon atoms, for example, 2-pyridyl, 4-pyridyl, 2-imidazolyl, 2-benzimidazolyl, 2-thiazolyl, or 2-oxazolyl), an alkoxy group (preferably, an alkoxy group having 1 to 20 carbon atoms, for example, methoxy, ethoxy, isopropyloxy, or benzyloxy), an aryloxy group (preferably, an aryloxy group having 6 to 26 carbon atoms, for example, phenoxy, 1-naphthyloxy, 3-methylphenoxy, or 4-methoxyphenoxy), an alkoxycarbonyl group (preferably, an alkoxycarbonyl group having 2 to 20 carbon atoms, for example, ethoxycarbonyl, or 2-ethylhexyloxycarbonyl), an amino group (preferably, an amino group having 0 to 20 carbon atoms, for example, amino, N,N-dimethylamino, N,N-diethylamino, N-ethylamino, or aniline), a sulfonamide group (preferably, a sulfonamide group having 0 to 20 carbon atoms, for example, N,N-dimethylsulfonamide or N-phenylsulfonamide), an acyloxy group (preferably, an acyloxy group having 1 to 20 carbon atoms, for example, acetyloxy or benzoyloxy), a carbamoyl group (preferably, a carbamoyl group having 1 to 20 carbon atoms, for example, N,N-dimethylcarbamoyl or N-phenylcarbamoyl), an acylamino group (preferably, an acylamino group having 1 to 20 carbon atoms, for example, acetylamino or benzoylamino), a cyano group, or a halogen atom (for example, a fluorine atom, a chlorine atom, a bromine atom, or an iodine atom). The substituent T is more preferably an alkyl group, an alkenyl group, an aryl group, a heterocyclic group, an alkoxy group, an aryloxy group, an alkxoycarbonyl group, an amino group, an acylamino group, a cyano group or a halogen atom, and particularly preferably an alkyl group, an alkenyl group, a heterocyclic group, an alkoxy group, an alkoxycarbonyl group, an amino group, an acyl amino group or a cyano group.

When a compound, a substituent or the like contains an alkyl group, an alkenyl group or the like, these may be linear or branched, and may be substituted or unsubstituted. Furthermore, when a compound, a substituent or the like contains an aryl group, a heterocyclic group or the like, those may be monocyclic or fused cyclic, and may be substituted or unsubstituted.

Specific examples of the linking group represented by $L^{11}$ include the following linking groups, but the present invention is not intended to be construed to be limited to these. In the following exemplary chemical structures, the single bond * means a side that is bonded to the hydrophenanthrene ring, and the single bond ** means the opposite side of the single bond *.

[Chem. 10]

    (L1-ex-1)

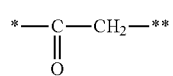    (L1-ex-2)

    (L1-ex-3)

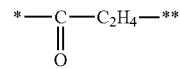    (L1-ex-4)

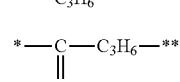    (L1-ex-5)

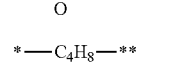    (L1-ex-6)

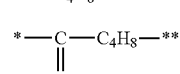    (L1-ex-7)

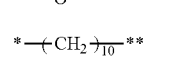    (L1-ex-8)

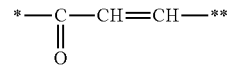    (L1-ex-9)

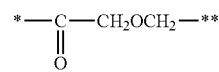    (L1-ex-10)

    (L1-ex-11)

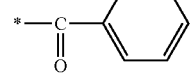    (L1-ex-12)

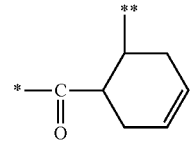    (L1-ex-13)

    (L1-ex-14)

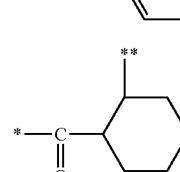    (L1-ex-15)

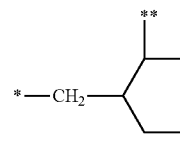    (L1-ex-16)

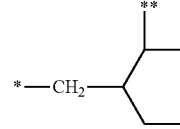    (L1-ex-17)

$L^{11}$ in general formula (A1) is, from the viewpoint of heat resistance, preferably *-CO-**, *-COO-**, a single bond, (L1-ex-4), (L1-ex-10) or (L1-ex-12); and more preferably *-CO-**, *-COO-**, or a single bond.

In the general formula (A1), $L^{11}$ may be bonded to any carbon atom shown at the 1-position, the 2-position, or the 4-position in the formula, but it is preferable that $L^{11}$ be bonded to the carbon atom shown at the 2-position or the 4-position, and it is more preferable that $L^{11}$ be bonded to the carbon atom shown at the 2-position. This bonding position is also the same for the (2) polyester-based polymer [II] and the polyamide-based polymer that will be described below. The position numbers of the carbon atoms in the general formula (A1) is that with respect to the position numbers of abietane, the 1-position corresponds to the 11-position, the 2-position to the 12-position, the 3-position to the 13-position, and the 4-position to the 14-position.

$L^{12}$ $L^{12}$ is preferably a carbonyl group or a carbonyloxy group. In other words, in an embodiment related to this polyester-based polymer [I], the DA main skeleton constitutes the DAA skeleton.

Another suitable embodiment of the polyester-based polymer [I] contains a dimer structure in which two dehydroabietane main skeleton are bonded directly to each other or through a linking group, in a repeating unit as a portion of the main chain. A repeating unit containing this dimer structure is, for example, represented by the general formula (A2).

~Repeating Unit Represented by General Formula (A2)~

$L^{21}$ and $L^{22}$ $L^{21}$ or $L^{22}$ in the general formula (A2) is preferably a group containing a carbonyl group or a carbonyloxy group, and is more preferably a carbonyl group or a carbonyloxy group. This implies that, similarly to the case of $L^{12}$, the particular polymer of the present embodiment is configured to have a repeating unit containing the DAA skeleton.

$L^{23}$ $L^{23}$ is preferably at least one of an oxygen atom, a sulfur atom, a carbonyl group, a sulfonyl group, an alkylene group, an alkenylene group, an arylene group, and a single bond. The alkylene group and the alkenylene group may be linear or branched chain-shaped, or may be cyclic. The linking group represented by $L^{23}$ is, for the viewpoint of heat resistance, more preferably composed of at least one of an oxygen atom, a sulfur atom, a carbonyl group, a sulfonyl group, an alkylene group having 2 to 10 carbon atoms, an alkenylene group having 2 to 10 carbon atoms, an arylene group having 6 to 18 carbon atoms, and a single bond; and even more preferably a divalent linking group composed of at least one of an oxygen atom, a sulfur atom, a carbonyl group, a sulfonyl group, a chain-like alkylene group having 2 to 4 carbon atoms, a cyclic alkylene group having 5 to 6 carbon atoms, a chain-like alkenylene group having 2 to 4 carbon atoms, a cyclic alkenylene group having 5 to 6 carbon atoms, an arylene group having 6 to 8 carbon atoms, and a single bond, or a single bond.

The alkylene group, alkenylene group and arylene group that constitute the linking group represented by $L^{23}$ may further have a substituent if possible. The substituent for the alkylene group, alkenylene group and arylene group may be the substituent T described above. Specific examples of the linking group represented by $L^{23}$ include the following linking groups, but the present invention is not intended to be limited to these.

[Chem. 11]

—O— (L2-ex-1)

—CH$_2$— (L2-ex-2)

—S— (L2-ex-3)

(L2-ex-4)

—SO$_2$— (L2-ex-5)

—CH=CH— (L2-ex-6)

—CH$_2$CH$_2$— (L2-ex-7)

—SCH$_2$CH$_2$S— (L2-ex-8)

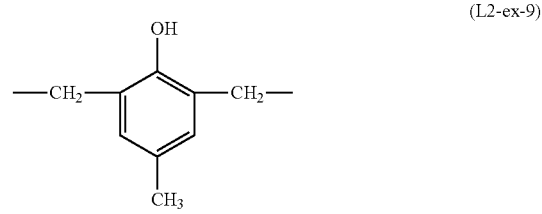

(L2-ex-9)

(L2-ex-10)

(L2-ex-11)

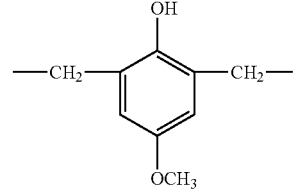
(L2-ex-12)

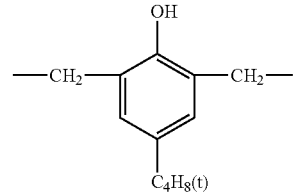
(L2-ex-13)

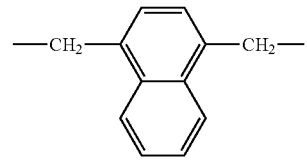
(L2-ex-14)

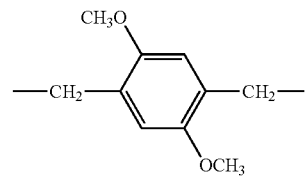
(L2-ex-15)

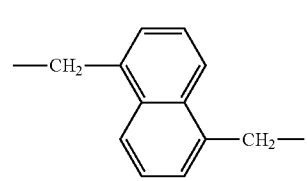

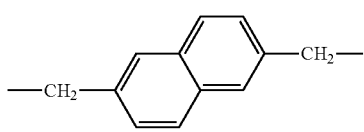
(L2-ex-16)

From the viewpoint of the ease of synthesis, $L^{23}$ is preferably (L2-ex-2), (L2-ex-5), (L2-ex-9) or (L2-ex-11), and more preferably (L2-ex-2).

In the general formula (A2), $L^{23}$ may be a linking group that is bonded to any of the carbon atoms shown at the 1-position, 2-position, 4-position, 1'-position, 2'-position and 4'-position in the formula, but $L^{23}$ is preferably a linking group that is bonded to the carbon atom shown at the 2-position, 4-position, 2'-position and 4'-position (provided that the linking group is a combination linking two hydrophenanthrene ring), and more preferably a linking group that is bonded to the carbon atom shown at the 2-position and 2'-position. These bonding positions are also the same as the positions for the (2) polyester-based polymer [II] that will be described below.

In regard to the repeating units derived from dicarboxylic acid compounds that constitute the polyester-based polymer [I], the total percentage content of the repeating unit represented by general formula (A1) and the repeating unit represented by general formula (A2) is not particularly limited, but the total amount of the structural moieties that constitute the repeating units (when the total amount of repeating units derived from dicarboxylic acid compounds is 50 mol %) is, from the viewpoints of the degree of plant derivation and the density, preferably 10 mol % or more, more preferably 20 mol % or more, even more preferably 30 mol % or more, and still more preferably 40 mol % or more.

The polyester-based polymer [I] of the present embodiment may be a copolymer with other dicarboxylic acid compounds. Regarding the other dicarboxylic acid compounds, any dicarboxylic acid compound that is usually used to construct a polyester-based polymer can be used without particular limitations, and for example, the dicarboxylic acid compounds described in Synthetic PolymersV (Asakura Shoten Co., Ltd.), p. 63-91 and the like can be used.

Examples of the other dicarboxylic acid compounds include aromatic dicarboxylic acids such as terephthalic acid, isophthalic acid, and naphthalenedicarboxylic acid; and aliphatic dicarboxylic acids such as cyclohexanedicarboxylic acid, dicyclohexanedicarboxylic acid, and adipic acid. The percentage content of repeating units derived from other dicarboxylic acid compounds in the polyester-based polymer [I] is not particularly limited as long as the percentage content is in the range that does not impair the effect of the present invention. For example, the percentage content of repeating units derived from other dicarboxylic acid compounds is preferably 40 mol % or less, and more preferably 30 mol % or less, of the repeating units derived from dicarboxylic acid compounds that constitute the polyester-based polymer [I].

<Repeating Unit Derived from Diol Compound>
Diol Compound Containing Ring Structure The polyester-based polymer [I] of the present embodiment preferably includes at least one repeating unit derived from a diol compound having a ring structure. The ring structure that is included in the diol compound may be included in a side chain region of the particular polymer (polyester-based polymer [I]), or may be included to constitute a portion of the main chain; however, from the viewpoint of heat resistance, it is preferable that the cyclic structure included in the diol compound constitute a portion of the main chain. Thereby, heat resistance is further enhanced.

The cyclic structure included in the diol compound may be an aliphatic ring or an aromatic ring, and may also be a hydrocarbon ring or a heterocyclic ring. Furthermore, the aliphatic ring may be a ring containing an unsaturated bond. Furthermore, the number of rings included in the diol compound is not particularly limited, but can be adjusted to, for example, 1 to 5. From the viewpoint of availability of the raw material, the number of rings is preferably 1 to 3, and more preferably 1 to 2. When the diol compound contains two or more ring structures, the ring structure may be a structure in which two or more monocyclic rings are linked by a covalent bond or a linking group, or may be a fused ring structure.

Specific examples of the repeating unit derived from a diol compound having a ring structure include, for example, repeating units derived from cyclohexanediol, cyclohexanedimethanol, 1,4-bis(2-hydroxyethoxy)benzene, 1,4-bis(2-hydroxypropoxy)benzene, and 4-hydroxyethyl phenol; and repeating units derived from a diol compound represented by the following general formula (B1). The repeating unit derived from a diol compound having a ring structure is, from the viewpoint of heat resistance, preferably a repeating unit derived from a diol compound represented by the following general formula (B1):

[Chem. 12]

Formula (B1)

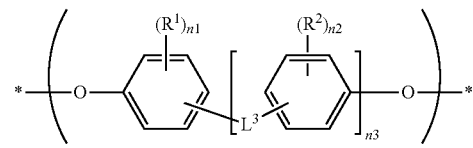

In general formula (B1), $L^3$ represents a divalent linking group containing at least one of an oxygen atom, a carbonyl group, a sulfonyl group and an alkylene group, or a single bond. When there are present plural $L^3$'s, the respective $L^3$'s may be identical or different. $R^1$ and $R^2$ each independently represent a halogen atom, an alkyl group or an alkoxy group, or may also be bonded to each other and form a ring. Furthermore, when there are present plural $R^1$'s and $R^2$'s, the respective $R^1$'s and $R^2$'s may be identical or different. n1 and n2 each independently represent an integer of 0 to 4, and n3 represents an integer of 0 to 2.

The alkylene group that constitutes the divalent linking group for $L^3$ may be a linear or branched chain-like alkylene group, or may be a cyclic alkylene group. Furthermore, the number of carbon atoms of the alkylene group is, from the viewpoint of heat resistance, preferably 1 to 6, and more preferably 1 to 4. The number of carbon atoms of the alkylene group as used herein is defined not to include the number of carbon atoms of the substituent that will be described below. Furthermore, the alkylene group may have a substituent such as a linear or cyclic alkyl group having 1 to 6 carbon atoms, or an aryl group having 6 to 18 carbon atoms. The number of substituents in the alkylene group may be 2 or more, and when the alkylene group has two or more substituents, the two or more substituents may be identical or different, or may be bonded to each other and form a ring.

$R^1$ and $R^2$ each independently represent any one of a halogen atom, an alkyl group and an alkoxy group, but from the viewpoint of availability of the raw material, $R^1$ and $R^2$ are each preferably any of a fluorine atom, a chlorine atom, an alkyl group having 1 to 8 carbon atoms, and an alkoxy group having 1 to 8 carbon atoms.

n1 and n2 each represent an integer of 0 to 4, but are each preferably an integer of 0 to 2, more preferably 0 or 1, and even more preferably 0. n3 represents an integer of 0 to 2, but is preferably 0 or 1.

Specific examples of the repeating unit represented by general formula (B1) will be shown below, but the present invention is not intended to be limited to these.

[Chem. 13]

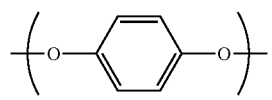
(B1-ex-1)

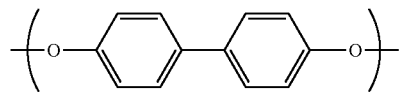
(B1-ex-2)

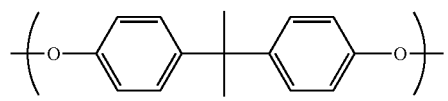
(B1-ex-3)

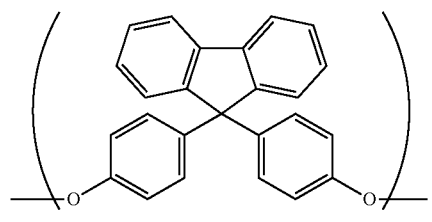
(B1-ex-4)

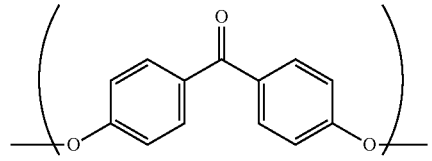
(B1-ex-5)

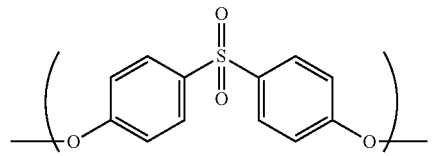
(B1-ex-6)

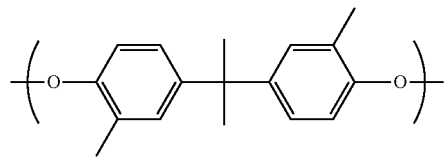
(B1-ex-7)

-continued

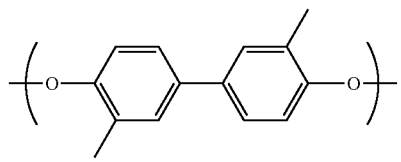
(B1-ex-8)

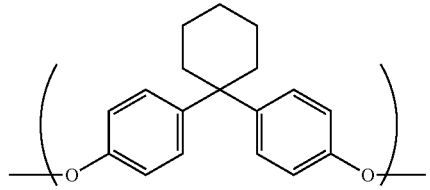
(B1-ex-9)

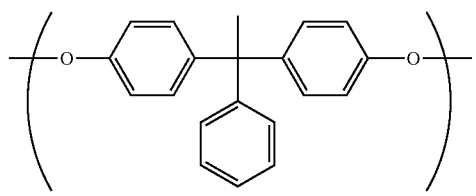
(B1-ex-10)

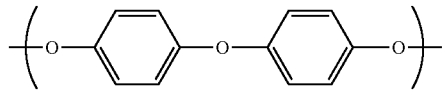
(B1-ex-11)

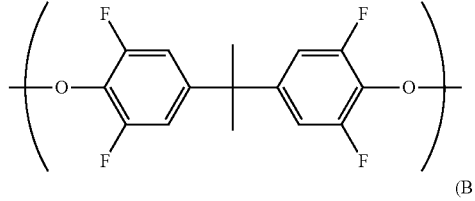
(B1-ex-12)

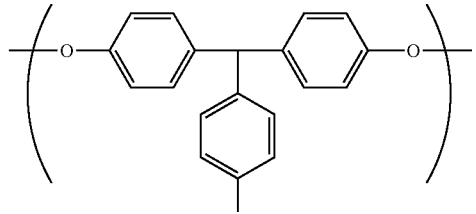
(B1-ex-13)

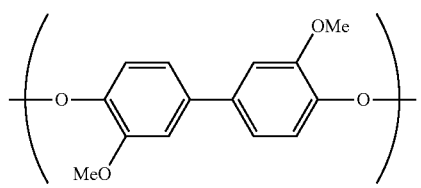
(B1-ex-14)

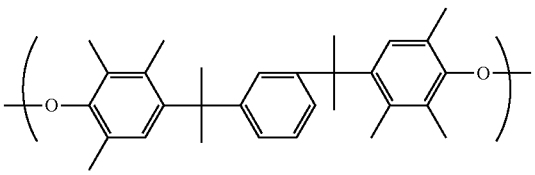
(B1-ex-15)

The repeating unit represented by general formula (B1) is, from the viewpoint of heat resistance, preferably (B1-ex-1), (B1-ex-2), (B1-ex-3), (B1-ex-4), (B1-ex-5), (B1-ex-6), or (B1-ex-11), and more preferably (B1-ex-1), (B1-ex-2) or (B1-ex-3).

The percentage content of the repeating unit represented by general formula (B1) among the repeating units derived from the diol compounds that constitute the polyester-based polymer [I] is not particularly limited, but the percentage content is, from the viewpoints of heat resistance and density, preferably 10 mol % or more, more preferably 20 mol % or more, even more preferably 30 mol % or more, and still more preferably 40 mol % or more, relative to the total amount of the structural moieties that constitute the repeating units (when the total amount of the repeating units derived from diol compounds is 50 mol %).

Diol Compound that does not Contain Ring Structure

The polyester-based polymer [I] may also be a polymer including at least one of repeating units derived from other diol compounds that do not contain a ring structure. Regarding the diol compounds that do not contain a ring structure, those diol compounds that are generally used to construct polyester-based polymers can be used without any particular limitations, and examples thereof include diol compounds such as ethylene glycol, 1,2-propanediol 1,3-propanediol, 1,4-butanediol, 1,6-hexanediol, 1,8-octanediol, 1,10-decanediol, 1,12-dodecanediol, diethylene glycol, triethylene glycol, and tetraethylene glycol.

The percentage content of the repeating units derived from diol compounds that do not contain a ring structure in the polyester-based polymer [I] is the same as the percentage content of the repeating units derived from diol compounds containing a ring structure, in terms of the preferred range.

The polyester-based polymer [I] of the present embodiment is, from the viewpoint of heat resistance, preferably a polymer related to a combination including at least one repeating unit derived from a dicarboxylic acid compound as described below and at least one repeating unit derived from a dial compound as described below.

Repeating Unit Derived from Dicarboxylic Acid Compound

General formula (A1) ... $L^{11}$ represents a carbonyl group, formula (L1-ex-4), (L1-ex-10) or (L1-ex-12); and $L^{12}$ is a carbonyl group.

General formula (A2) ... $L^{23}$ represents formula (L2-ex-2), (L2-ex-5), (L2-ex-9) or (L2-ex-11); and $L^{21}$ and $L^{22}$ are each a carbonyl group.

Repeating Unit Derived from Diol Compound

Formula (B1-ex-1), (B1-ex-2), (B1-ex-3), (B1-ex-4), (B1-ex-5), (B1-ex-6) or (B1-ex-11).

More preferred examples include the following.

Repeating Unit Derived from a Dicarboxylic Acid Compound

General formula (A1) ... $L^{11}$ and $L^{12}$ are each a carbonyl group.

General formula (A2) ... $L^{23}$ represents (L2-ex-2); and $L^{21}$ and $L^{22}$ are each a carbonyl group.

Repeating Units Derived from Diol Compounds

Formula (B1-ex-1), (B1-ex-2), (B1-ex-3) or (B1-ex-4)

The content ratio of the repeating unit derived from a dicarboxylic acid compound and the repeating unit derived from a diol compound that constitute the polyester-based polymer [I] of the present embodiment (repeating unit derived from a dicarboxylic acid compound'repeating unit derived from a diamine compound) is not particularly limited, but the content ratio is usually 1:1.

(Method for Producing Polyester-Based Polymer [I])

Dehydroabietic acid used in the production of the polyester-based polymer [I] of the present embodiment can be obtained from, for example, rosin. The constituent components included in rosin may vary depending on the methods for collecting these or the growing areas of pine; however, the constituent components are generally a mixture of diterpene-based resin acids such as abietic acid (1), neoabietic acid (2), palustric acid (3), levopimaric acid (4), dehydroabietic acid (5), pimaric acid (6), and isopimaric acid (7). Among these diterpene-based resin acids, the respective compounds represented by from (1) to (4) undergo non-homogenization when heat treated in the presence of a certain kind of metal catalyst, and are modified to dehydroabietic acid (5) and dihydroabietic acid (8) having the following structure. That is, dehydroabietic acid (5) necessary for the production of the polyester-based polymer [I] of the present invention can be relatively easily obtained by subjecting rosin, which is a mixture of various resin acids, to an appropriate chemical treatment, and thus can be industrially produced at low cost. Furthermore, dihydroabietic acid (8) and dehydroabietic acid (5) can be easily separated by known methods.

[Chem. 14]

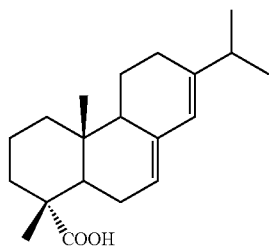

(1)

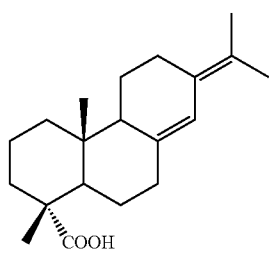

(2)

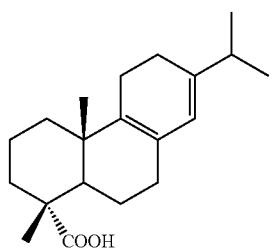

(3)

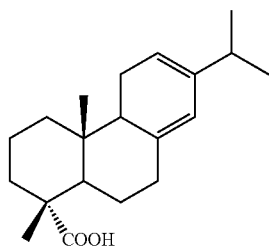

(4)

For example, in regard to the process of synthesizing the polyester-based polymer [I] having a repeating unit represented by general formula (A1) or (A2) and a repeating unit represented by general formula (B1), the polyester-based polymer can be synthesized by polycondensing a diol compound forming the repeating unit represented by general formula (B1) and a dicarboxylic acid compound forming the repeating unit represented by general formula (A1) or (A2) or a derivative thereof, which may be a dicarboxylic acid halide derivative or a diester derivative, by a known method. When this series of processes are schematically illustrated, the processes can be explained in two divided parts as shown in the following Scheme 1 and Scheme 2. The reaction schemes described below is an example according to the present invention, and the present invention is not intended to be construed to be limited to this explanation.

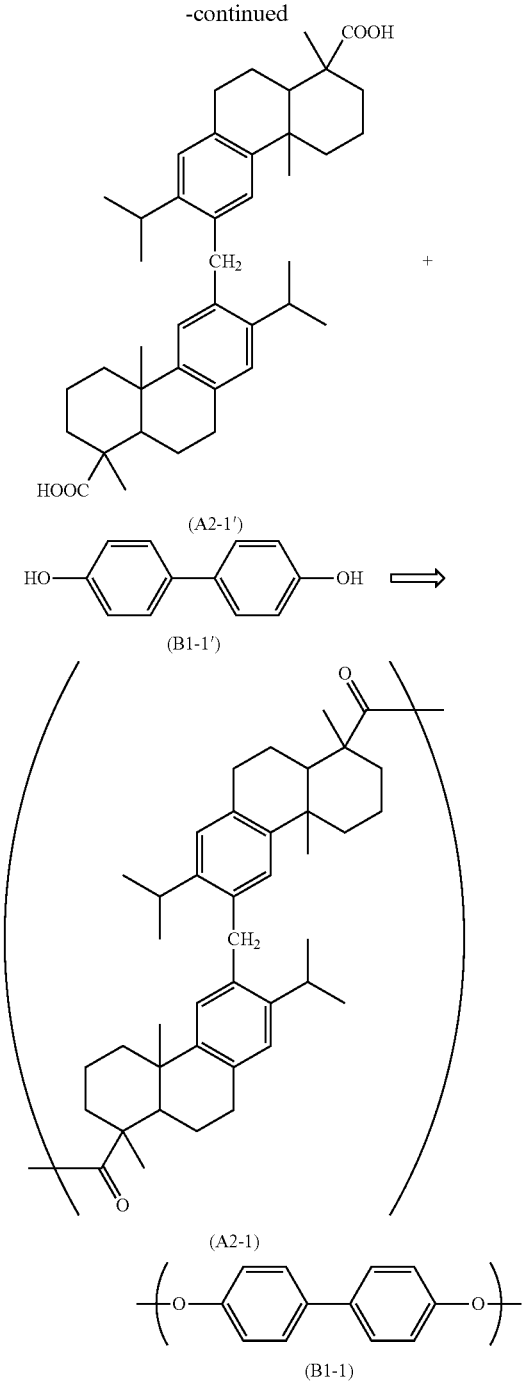

Specific examples of the synthesis method for the polymer include the methods described in New Polymer Experimentology3, Synthesis and Reaction of Polymers (2), pages 78 to 95, Kyoritsu Shuppan Co., Ltd. (1996) (for example, melt polymerization methods such as a trans-esterification method, a direct esterification method, and an acid halide method; a low temperature solution polymerization method, a high temperature solution polycondensation method, and an interfacial polycondensation method). In the present invention, an acid chloride method and an interfacial polycondensation method are particularly preferably used.

The trans-esterification method is a method of synthesizing the polyester-based polymer [I] by subjecting a diol compound and a dicarboxylic acid ester derivative to dealcoholation polycondensation by heating the compounds in a molten state or a solution state, if necessary, in the presence of a catalyst.

The direct esterification method is a method of synthesizing the polyester-based polymer [I] by subjecting a diol compound and a dicarboxylic acid compound to dehydration polycondensation in a molten state or a solution state in the presence of a catalyst under heating.

The acid halide method is a method of synthesizing the polyester-based polymer [I] by subjecting a diol compound and a dicarboxylic acid halide derivative to dehydrohalogenation polycondensation by heating the compounds in a molten state or a solution state, if necessary, in the presence of a catalyst.

The interfacial polymerization method is a method of synthesizing the polyester-based polymer [I] by dissolving a diol compound in water while dissolving the dicarboxylic acid compound or a derivative thereof in an organic solvent, and subjecting the compounds to polycondensation at the interface of water/organic solvent by using a phase transfer catalyst.

The dimer of dehydroabietic acid (DAA) of Scheme 2 can be synthesized by the method described in JP2011-26569A.

(2) Polyester-Based Polymer [II]

In the present embodiment, the linking groups are respectively preferably the following linking groups.

$L^{11}$ $L^{11}$ represents a single bond, *-$L^{14}$-O-** or *-$L^{14}$-CO-**. Symbol * represents a single bond on the hydrophenanthrene ring side, and symbol ** represents a single bond on the opposite side of the single bond represented by symbol *. The divalent linking group represented by $L^{14}$ is not particularly limited, but examples include —($C_nH_{2n}$)— and —(CO($C_nH_{2n}$)— (wherein n represents an integer of 1 to 12, and preferably 1 to 8; the group may be linear, branched or cyclic, and may further have a substituent; and the group may have a structure in which one or more carbon atoms that constitute molecular chain have been substituted by oxygen atoms). When the atom that is bonded to $L^{14}$ is an oxygen atom, the divalent linking group is preferably —$(CH_2)_4$—, —$(CH_2)_5$— or —$(CH_2)_6$—. When the atom that is bonded to $L^{14}$ is a carbonyl group, the divalent linking group is preferably —$(CH_2)_3$—, —$(CH_2)_4$—, —$(CH_2)_5$—, —$CO(CH_2)_2$—, —$CO(CH_2)_3$—, or —$CO(CH_2)_4$—.

$L^{12}$ $L^{12}$ represents *-$CH_2$—O-**. Symbol * represents a single bond on the hydrophenanthrene ring side, and symbol ** represents a single bond on the opposite side of the single bond represented by symbol *.

$L^{21}$ $L^{21}$ represents *-$CH_2$—O-** or *-$CH_2$—O—CO-($L^{24}$-CO)$_n$-**. Symbol * represents a single bond on the hydrohphenanthrene ring side, and symbol ** represents a single bond on the opposite side of the single bond represented by symbol *. $L^{24}$ represents an alkylene group or an arylene group. A preferred number of carbon atoms of the alkylene group is 1 to 20, and particularly preferably 2 to 12. The alkylene group may be any of linear, branched or cyclic, and may further have a substituent. The alkylene group may have a structure in which one or more carbon atoms constituting the molecular chain have been substituted by oxygen atoms. Specific examples of the alkylene group include —$CH_2$—, —$(CH_2)_2$—, —$(CH_2)_3$—, —$(CH_2)_4$—, —$(CH_2)_6$—, —$(CH_2)_8$—, —$CH_2OCH_2$—, —$CH_2OCH_2CH_2OCH_2$—, and —$C_6H_{10}$—. n represents 0 or 1, A preferred number of carbon atoms of the arylene group represented by $L^{24}$ is 6 to 20, and particularly preferably 6 to 15. The arylene group may be monocyclic or fused cyclic, and may further have a substituent. Specific examples of the arylene group include —$C_6H_4$—, —$C_{10}H_6$—, —$C_6H_4C_6H_4$—, —$C_6H_4OC_6H_4$— and —$C_6H_4COC_6H_4$—.

$L^{24}$ is preferably —$(CH_2)_2$—, —$C_6H_{10}$—, —$C_6H_4$— or —$C_{10}H_8$—.

$L^{22}$ $L^{22}$ represents *-$CH_2$—O-**. Symbol * represents a single bond on the hydrophenanthrene ring side, and symbol ** represents a single bond on the opposite side of the foregoing single bond.

$L^{23}$ $L^{23}$ has the same meaning as defined for the (1) polyester-based polymer [I], and also has the same preferred range.

(Method for Producing Polyester-Based Polymer [II])

The polymer of the present embodiment can be synthesized by, for example, the following Scheme 3. The following is an example of the reaction route, and the present invention is not construed to be limited to this. The reaction route illustrates the embodiment represented by the general formula (A1), but since the reaction route is the same except that a dimer having two dehydroabietane main skeleton is produced, the reaction route for the general formula (A2) will not be repeated here. The process for dimerization is the same as in the case of the polyester-based polymer [I].

Scheme 3

[Chem. 17]

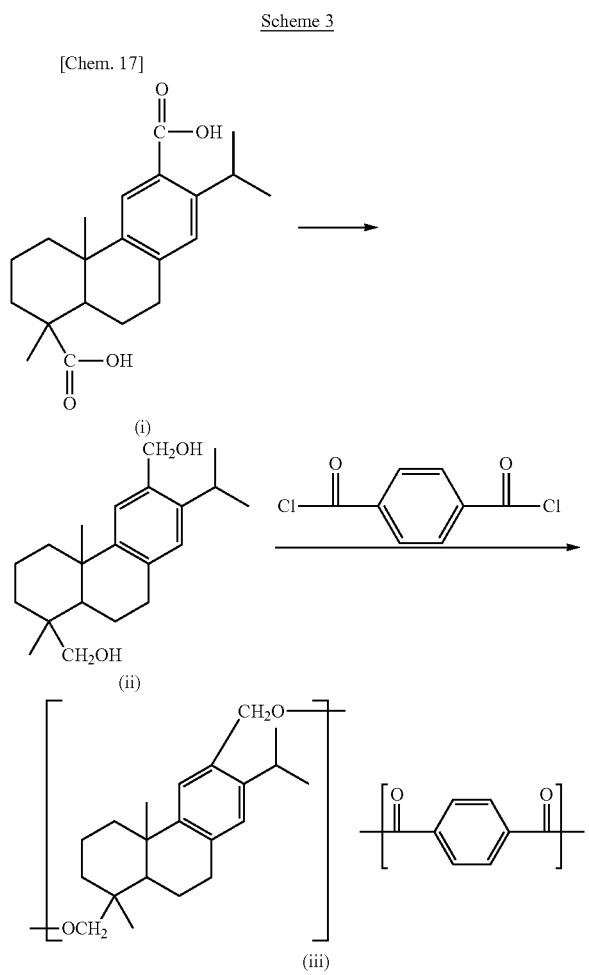

Synthesis of the dicarboxylic acid form of (i) can be carried out in the same manner as in the case of (I) of the polyester. The reaction converting from a dicarboxy compound (i) obtained by introducing a carboxy group into dehydroabietic acid, to a dihydroxy compound (ii) may be carried out by a conventional reduction reaction. For example, the reduction reaction can be rapidly carried out by conducting reduction with lithium aluminum hydride. The reaction for obtaining a polyester (iii) by a reaction between the dihydroxy compound (ii) and a polycarboxylic acid chloride compound can be carried out by making reference to, for example, the Synthesis Example that will be described below.

Regarding the process of allowing a dihydroxy compound to react with terephthalic acid dichloride, the same process as described for the polyester-based polymer [I] also applies. In addition, an esterification reaction may be conducted, or a transesterification reaction may be carried out by allowing a dicarboxylic acid, and in regard to these reaction, the same processes as described for the polyester-based polymer [I] also apply.

In regard to the details of the production method or compounds for the (1) polyester-based polymer [I], reference can be made to JP2011-026569A. In regard to the details of the production method or compounds for the (2) polyester-based polymer [II], reference can be made to JP2011-074249A.

[Constituent Members of Photoreceptor]

(Support)

Examples of the conductive support 1 (see FIG. 1) that can be used in the electrophotographic photoreceptor of the present invention include metal materials such as aluminum, stainless steel and nickel; and polyester films, phenol resin and paper, each provided with a conductive layer of aluminum, palladium, tin oxide, indium oxide or the like on the surface. The conductive support that can be used in the present invention is preferably a support having transparency (transparent support), and is more preferably a cylindrical transparent support.

(Charge Generating Layer)

The charge generating layer 3 in the electrophotographic photoreceptor of the present invention can be formed on the conductive support by, for example, a method that is known per se, such as an immersion method, a spraying method or coating. Regarding the charge generating layer, organic pigments such as azoxybenzene-based pigments, disazo-based pigments, trisazo-based pigments, benzimidazole-based pigments, polycyclic quinoline-based pigments, indigoid-based pigments, quinacridone-based pigments, phthalocyanine-based pigments, perylene-based pigments, and methine-based pigments can be used. The charge generating agents may be used singly, or may be used in combination of plural kinds. These charge generating agents are used in the form in which fine particles thereof are dispersed in binder resins such as a polyvinyl butyral resin, a polyvinyl formal resin, a silicone resin, a polyamide resin, a polyester resin, a polystyrene resin, a polycarbonate resin, a polyvinyl acetate resin, a polyurethane resin, a phenoxy resin, an epoxy resin and various celluloses. Particularly, a charge generating agent is incorporated into a binder resin containing a polymer having a skeleton derived from dehydroabietic acid in a repeating unit, and it is preferable to use this as a dope for forming a photosensitive layer of the electrophotographic photoreceptor.

(Charge Transporting Layer)

The charge transporting layer 4 in the electrophotographic photoreceptor of the present invention is preferably formed on the charge generating layer by dispersing a charge transporting agent using a resin including a particular polymer having a repeating unit containing the skeleton derived from dehydroabietic acid as a binder resin, by a known method such as, for example, an immersion method, a spraying method or coating. Examples of the charge transporting agent include polytetracyanoethylene; fluorenone-based compounds such as 2,4,7-trinitro-9-fluorene; nitro compounds such as dinitroanthracene; succinic anhydride; maleic anhydride; dibromomaleic anhydride; triphenylmethane-based compounds; oxadiazole-based compounds such as 2,5-di(4-dimethylaminophenyl)-1,3,4-oxadiazole; styryl-based compounds such as 9-(4-diethylaminostyryl)anthracene; carbazole-based compounds such as poly-N-vinylcarbazole; pyrazoline-based compounds such as 1-phenyl-3-(p-dimethylaminophenyl)pyrazoline; amine derivatives such as 4,4', 4"-tris(N,N-diphenylamino)triphenylamine; conjugated unsaturated compounds such as 1,1-bis(4-diethylaminophenyl)-4,4-diphenyl-1,3-butadiene; hydrazone-based compounds such as 4-(N,N-diethyl amino)benzaldehyde-N,N-diphenylhydrazone; nitrogen-containing cyclic compounds such as indole-based compounds, oxazole-based compounds, isoxazole-based compounds, thiazole-based compounds, thiadiazole-based compounds, imidazole-based compounds, pyrazole-based compounds, pyrazoline-based compounds, and triazole-based compounds; and fused polycyclic compounds. The charge transporting agents may be used singly, or may be used in combination of plural kinds.

(Molding Method and the Like)

The binder resin can be easily molded by wet molding. In order for an electrophotographic photoreceptor molded by wet molding to obtain sufficient film strength, the intrinsic viscosity of the binder resin is preferably 0.30 dl/g to 2.0 dl/g, and when film-forming properties are emphasized, the intrinsic viscosity is preferably 0.3 dl/g to 1.5 dl/g.

The charge generating layer and the charge transporting layer can be formed by dissolving each of the charge generating agents or charge transporting agents in a binder resin and an appropriate solvent, applying the solution on a conductive support by an immersion coating method, a spraying method or the like, and drying the solution.

Solvents can be broadly divided into two kinds of halogen-based organic solvents and non-halogen-based solvents, but generally, halogen-based solvents having low flammability are frequently used. However, in recent years, from the viewpoint of safety or environmental preservation, the proportion of the use of non-halogen-based solvents is building up. Therefore, a binder resin is required to have solubility in non-halogen-based solvents and solution stability, but the binder resin of the present invention is preferable from the viewpoint of being satisfactorily soluble in many non-halogen-based solvents.

Examples of the non-halogen-based solvents used include aromatic solvents such as benzene, toluene and xylene; ketone-based solvents such as acetone, methyl ethyl ketone, and cyclohexanone; ether-based solvents such as tetrahydrofuran, dioxane, and ethylene glycol diethyl ether; ester-based solvents such as methyl acetate, ethyl acetate and ethyl cellosolve; alcohol-based solvents such as methanol, ethanol and isopropanol; other dimethylformamide, dimethyl sulfoxide, and dimethylformamide. Furthermore, examples of the halogen-based solvents include methylene chloride, chloroform, tetrachlorocarbon, ethylene chloride, tetrachloroethane, and chlorobenzene. These solvents may be used alone, irrespective of being a non-halogen type or a halogen type, or two or more kinds may be used in combination as a solvent for mixing.

The mixing ratio (mass basis) of the charge generating agent and the binder resin is preferably in the range of 10:1 to 1:20. The thickness of this charge generating layer is generally 0.01 µm to 20 µm, and preferably, a thickness of 0.1 µm to 2 µm is suitable. Furthermore, the mixing ratio (mass basis) of the charge transporting agent and the binder resin is preferably in the range of 10:1 to 1:10. The thickness of this charge transporting layer is generally 2 µm to 100 µm, and preferably, a thickness of 5 µm to 30 µm is suitable.

[Copying Machine]

Figure 2:
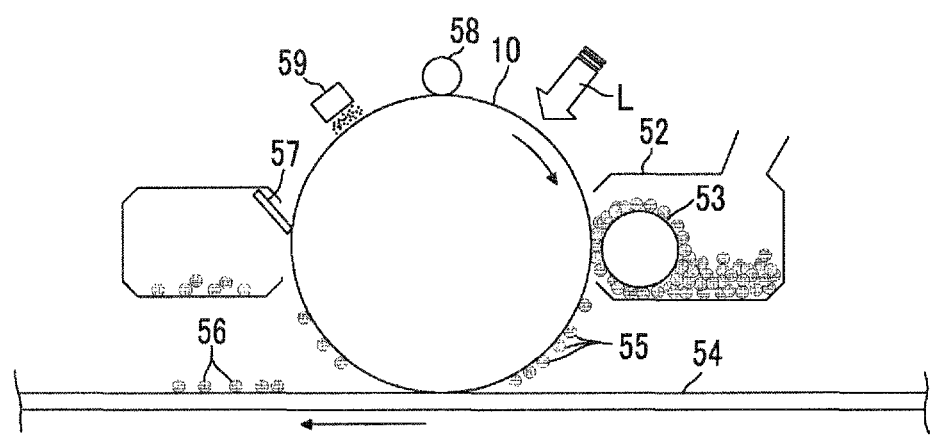
FIG. 2 is a perspective view diagram schematically illustrating the copying mechanism of a copying machine as an embodiment of the present invention.

The configuration of the copying machine of the present invention is not particularly limited, but it is preferable that the configuration have the mechanism illustrated in FIG. 2. The copying machine of the present embodiment includes the electrophotographic photoreceptor 10 related to the embodiments described above. The configuration of FIG. 2 is schematically illustrated, and the dimension or positional relations of the various members are not construed to be limited to the configuration embodiment described in FIG. 2. This electrophotographic method is typically carried out by the apparatus configuration and process described below (see FIG. 1). First, the surface of a photoreceptor 10 (latent image retaining body) utilizing a photoconductive substance is charged by a charging means 58, the surface is subjected to exposure L to electrically form a latent image. Toner is applied to the latent image formed here, from a drum 53 accommodated in a toner supply chamber 52, and thus a toner image is formed. At this time, toner 55 is charged to a charge opposite to that of the photoreceptor. Thereafter, this toner image is transferred to the surface of a transfer-receiving body such as paper 54 as necessary, through an intermediate transfer body (not shown in the diagram). This transfer image 56 is fixed by heating, pressurizing, solvent vapor or the like, and thereby a desired image can be obtained. The toner remaining on the surface of the photoreceptor is cleaned by a cleaner 57 as necessary, and is utilized again for the development of toner images. Furthermore, the photoreceptor is subjected to charge removal by a charge removing machine 59 in order to be prepared for next copying.

In regard to the operation of the copying machine, the electrophotographic photoreceptor of the present invention exhibits excellent photoelectric conversion characteristics and latent image retainability for the treatment by the charging means 58, exposure L, and charge removal means 59. Furthermore, the electrophotographic photoreceptor exhibits an excellent effect of showing high abrasion resistance against friction impact by the drum 53, cleaner 57 and the like.

EXAMPLES

Unless particularly stated otherwise, in the present Examples, the unit "parts" indicates "parts by mass".

Synthesis Example

Synthesis of Polyester-Based Polymer (PE-1)

A polyester-based polymer (PE-1) was synthesized by the following scheme.

[Chem. 18]

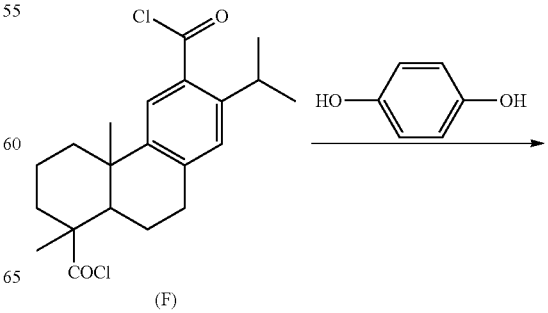

(F)

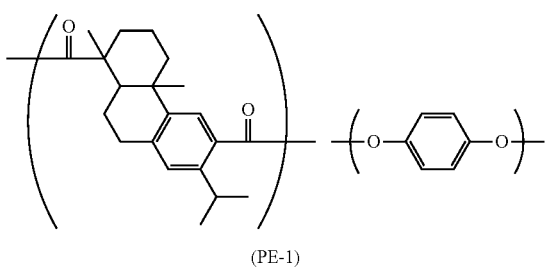

(PE-1)

In a nitrogen atmosphere, 385.4 g of hydroquinone (diol compound (b-1)) and 898 g of N,N'-dimethylaminopyridine were dissolved in 10 L of N-methylpyrrolidone. The temperature in the system was cooled to 10° C., and 1335 g of an acid chloride derivative (F) of a dicarboxylic acid compound (a-1) was divided in five portions and added to the solution. The reaction liquid gradually became viscous. After the mixture was stirred for 8 hours at room temperature, 25 ml of acetyl chloride was added to the reaction liquid, and the mixture was stirred for another 2 hours. 12.5 L of N-methylpyrrolidone and 18 L of ethyl acetate were added to dilute the reaction liquid, and the dilution was reprecipitated using a large amount of methanol. The (PE-1) thus produced was separated by filtration, and was washed with methanol. Crude (PE-1) thus obtained was dried and then was dissolved in tetrahydrofuran while being heated, and the operation of performing reprecipitation using methanol was repeated two times. After drying, 1430 g of (PE-1) as a white solid was obtained. The weight average molecular weight measured by a GPC analysis (solvent: NMP) of the polyester-based polymer (dehydroabietic acid polymer, PE-1) thus obtained was 85,000.

Synthesis of Polyester-Based Polymers (PE-2) to (PE-6)

Polyester-based polymers (PE-2) to (PE-6) were obtained by the same synthesis method as that of (PE-1), except that the dicarboxylic acid compound and the diol compound used in the synthesis of PE-1 were respectively changed to the compounds described in the following Table 1.

TABLE 1

| Resin | Dicarboxylic acid compound | Diol compound | Weight average molecular weight (Mw) | Degree of plant derivation (mass %) | Glass transition temperature (° C.) |
|---|---|---|---|---|---|
| PE-1 | a-1(50) | b-1(50) | 85,000 | 67.5 | 191 |
| PE-2 | a-1(50) | b-2(50) | 92,000 | 52.6 | 186 |
| PE-3 | a-1(50) | b-3(50) | 121,000 | 57.1 | 227 |
| PE-4 | a-2(50) | b-1(50) | 92,000 | 82.2 | 197 |
| PE-5 | a-2(50) | b-2(50) | 87,000 | 70.2 | 190 |
| PE-6 | a-2(50) | b-3(50) | 113,000 | 74.0 | 225 |

In the Table 1, the numbers inside parentheses for the dicarboxylic acid compounds and the diol compounds represent the feed amount (mol %) at the time of production of polyester-based polymers. Furthermore, the total amount of the dicarboxylic acid compound and the diol compound was adjusted to 100 mol %. Furthermore, the structures of the dicarboxylic acid compounds and the diol compounds are shown below.

[Chem. 19]

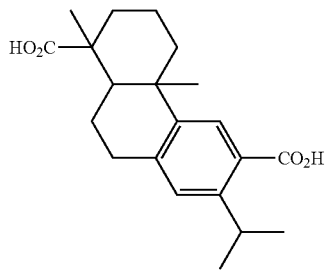

(a-1)

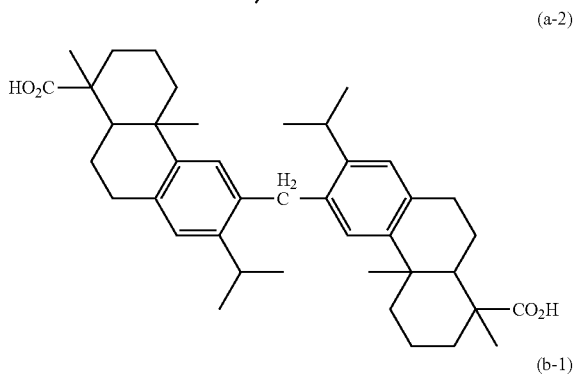

(a-2)

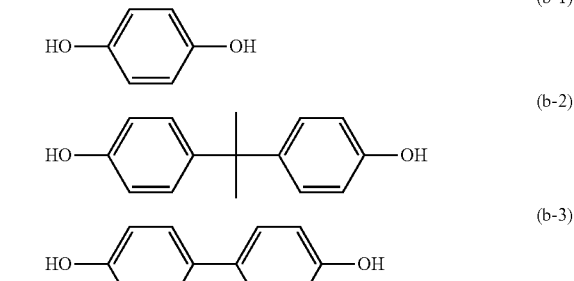

(b-1)

(b-2)

(b-3)

Example 1

Evaluation of Resin Solubility

In a sealable sample bottle, 80 parts of tetrahydrofuran (25° C.) and 20 parts of the polyester-based polymer (PE-1) were introduced, and solubility was evaluated. Next, tetrahydrofuran was changed to toluene, and solubility was evaluated (Test 101). The results are presented in Table 2. Discrimination of the evaluation was carried out as follows.

A: There was no dissolution residue recognizable by visual inspection.

B: There was a dissolution residue recognizable by visual inspection.

The glass transition temperature was measured under the conditions described below using a differential scanning calorimeter (manufactured by SII Technology, Inc., X-DSC 7000). Measurement was carried out two times using a same sample, and the second measurement result was employed.

Atmosphere inside the measurement chamber: nitrogen (50 mL/min)

Rate of temperature increase: 10° C./min

Measurement initiation temperature: 0° C.

Measurement completion temperature: 200° C.

Sample pan: aluminum pan

Mass of measurement sample: 5 mg

Calculation of Tg: The median temperature of the drop initiation temperature and the drop completion temperature in the DSC chart was defined as Tg.

Figure 3:
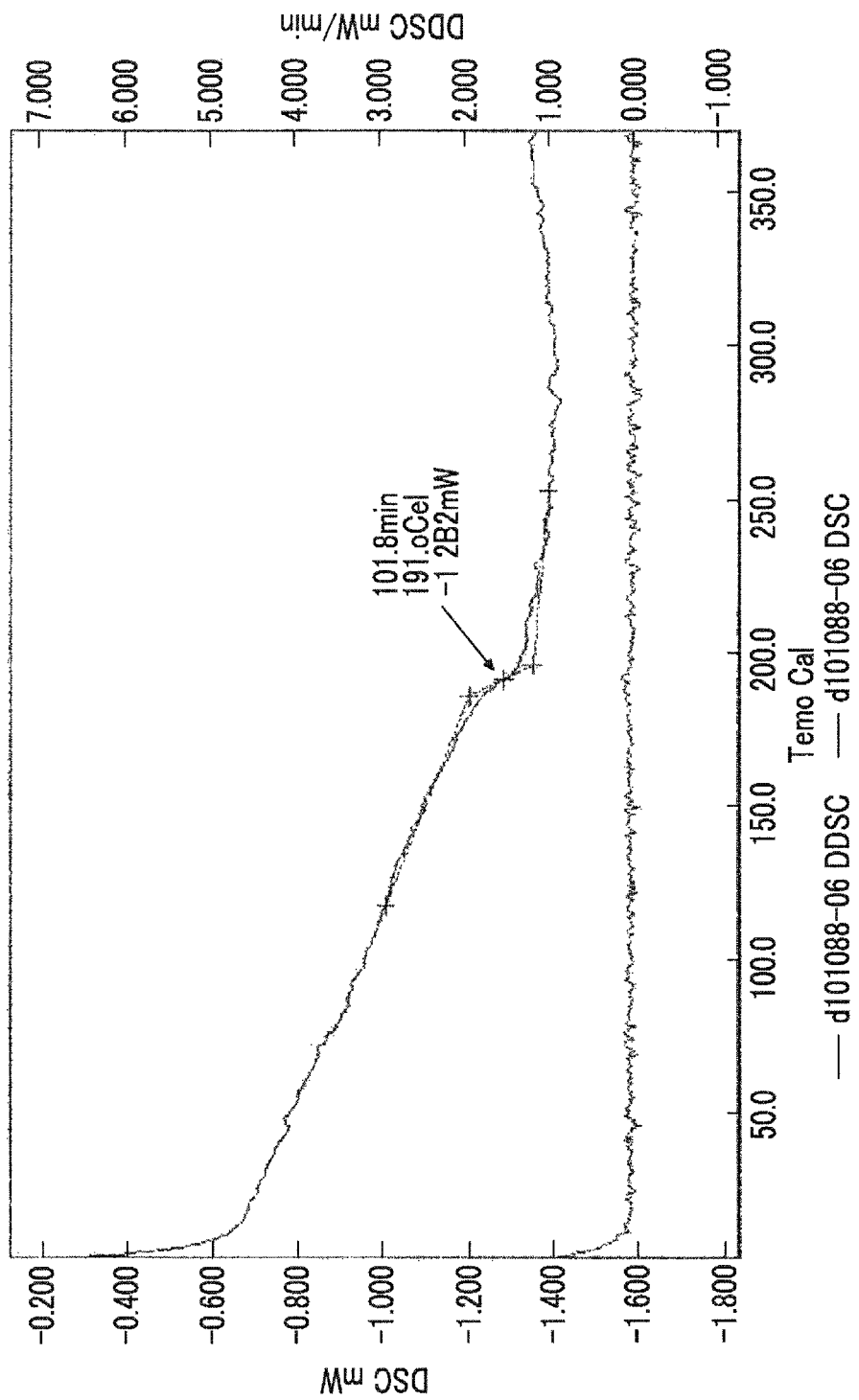
FIG. 3 is a DSC chart of a polyester-based polymer (PE-1) prepared in Example.

Evaluation of solubility was carried out in the same manner as described above, except that polyester-based polymer (PE-2) to polyester-based polymer (PE-6) were used instead of the polyester-based polymer (PE-1) used in test 101 (Tests 102 to 106). The results are shown in Table 2. Regarding the polyester-based polymer (PE-1), the DSC chart is shown in FIG. 3.

Evaluation of solubility was carried out in the same manner as described above, except that resin R-1 (polylactic acid; LACEA H-140; manufactured by Mitsui Chemicals, Inc.) and resin R-2 (polycarbonate; PANLITE TS-2040; manufactured by Teijin Kasei, Inc.) were used instead of the polyester-based polymer (PE-1) used in Test 101 (Tests c11 and c12). The Tg of the resin R-1 was 57° C., and the Tg of the resin R-2 was 172° C.

TABLE 2

| Test | Resin | Degree of plant derivation (mass %) | Solvent solubility THF | Toluene |
|---|---|---|---|---|
| 101 | PE-1 | 67.5 | A | A |
| 102 | PE-2 | 52.6 | A | A |
| 103 | PE-3 | 57.1 | A | A |
| 104 | PE-4 | 82.2 | A | A |
| 105 | PE-5 | 70.2 | A | A |
| 106 | PE-6 | 74.0 | A | A |
| c11 | R-1 | 100 | B | B |
| c12 | R-2 | 0 | A | A |

From the above table, it can be seen that the polyester-based polymer of the present invention has high solubility in tetrahydrofuran and toluene. The resin R-1 (polylactic acid) of Test c11 has a high degree of plant derivation, but since solvent solubility is poor, the resin is not preferable in electrophotographic photoreceptors.

Example 2

Evaluation of Electrophotographic Photoreceptor Characteristics

On a polyethylene terephthalate film having aluminum deposited to a thickness of about 50 nm, a coating liquid for a charge generating layer obtained by mixing 10 parts of i-type copper phthalocyanine, 5 parts of a phenoxy resin, 5 parts of a polyvinyl butyral resin, and 100 parts of dimethoxyethane, and distributing the mixture with a sand grind mill, was applied and dried. Thus, a charge generating layer having a thickness of about 0.5 μm was provided. Next, a coating liquid for a charge transporting layer obtained by mixing 50 parts of 4-(N,N-diethylamino)benzaldehyde-N,N-diphenylhydrazone, 50 parts of the polyester-based polymer (PE-1), and 350 parts of tetrahydrofuran was applied on the charge generating layer and dried in air. Subsequently, the coating liquid was dried for 8 hours below 100° C. to provide a charge transporting layer having a thickness of about 20 μm, and thus a laminate type electrophotographic photoreceptor was produced. For the evaluation of this laminate type electrophotographic photoreceptor, the charging characteristics were investigated using an electrostatic charging test apparatus, EPA-8100, manufactured by Kawaguchi Electric Works Co., Ltd. Furthermore, in regard to abrasion resistance, the amount of wear was measured using Taber Abrasion Testing Machine manufactured by Suga Test Instruments Co., Ltd. (Test 201).

The process was carried out in the same manner as in Test 201, except that the polyester-based polymers (PE-2) to (PE-6) were used instead of the polyester-based polymer (PE-1) (Tests 202 to 206).

The process was carried out in the same manner as in Test 201, except that the resin R-2 (polycarbonate; PANLITE TS-2040; manufactured by Teijin Kasei, Inc.) and the resin R-3 (polyphenylene resin; PARMAX-1201 KRUM; manufactured by Mississippi Polymer Technologies, Inc.) were used instead of the polyester-based polymer (PE-1) (c21 and c22). These results are shown in Table 3.

TABLE 3

| | Binder resin | | Electrophotographic photoreceptor characteristics | | |
|---|---|---|---|---|---|
| Test | Resin | Degree of plant derivation (mass %) | Initial potential (−V) | Residual potential (−V) | Amount of wear (mg) |
| 201 | PE-1 | 67.5 | 700 | 10 | 3.51 |
| 202 | PE-2 | 52.6 | 700 | 11 | 3.55 |
| 203 | PE-3 | 57.1 | 699 | 10 | 3.62 |
| 204 | PE-4 | 82.2 | 699 | 12 | 3.75 |
| 205 | PE-5 | 70.2 | 701 | 13 | 3.42 |
| 206 | PE-6 | 74.0 | 701 | 11 | 3.78 |
| c21 | R-2 | 0 | 700 | 9 | 3.51 |
| c22 | R-3 | 0 | 701 | 12 | 3.44 |

As can be seen from Table 3, the electrophotographic photoreceptor of the present invention has both satisfactory residual potential and abrasion resistance, with the properties at a level equal to or higher than those of an electrophotographic photoreceptor using existing synthetic resins, and therefore, sufficient stabilization of electrophotographic images and long service life of a photoreceptor can be expected. Furthermore, the electrophotographic photoreceptor of the present invention is preferable even from the viewpoint of environmental consideration since the photoreceptor uses a binder resin of plant origin, also exhibits satisfactory performance as described above, and is highly useful as a substitute technology to replace existing synthetic resins for a photoreceptor.

The present application is a continuation application of International Application No. PCT/JP2012/075449, filed Oct. 2, 2012, which claims priority to Japanese Patent Application No. 20H-222578, filed Oct. 7, 2011. The contents of these applications are incorporated herein by reference in their entirety.

What is claimed is:

1. An electrophotographic photoreceptor comprising a photosensitive layer on a conductive support,
wherein a binder resin that constitutes the photosensitive layer includes a polymer containing a skeleton derived from dehydroabietic acid in a main chain of the polymer.

2. The electrophotographic photoreceptor according to claim 1, wherein the skeleton derived from dehydroabietic acid contains a structure represented by the following general formula (U):

[Chem. 1]

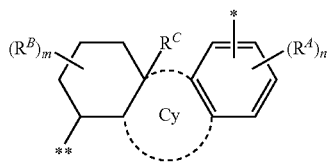

Formula (U)

herein $R^A$ and $R^B$ each represent an alkyl group or alkenyl group having 1 to 6 carbon atoms;

n and m each represent an integer of 0 to 3;

$R^C$ represents a hydrogen atom or an alkyl group having 1 to 3 carbon atoms;

ring Cy represents a saturated or unsaturated 6-membered ring or 7-membered ring, which may contain a heteroatom;

symbols * and ** each represent a single bond; and * may be a single bond extending from $R^A$.

3. The electrophotographic photoreceptor according to claim 1, wherein the polymer includes a repeating unit represented by the following general formula (A1) or (A2):

[Chem. 2]

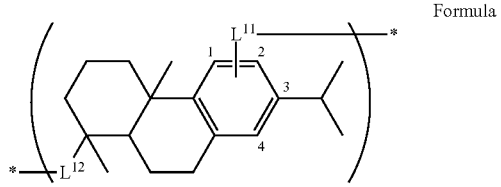

Formula (A1)

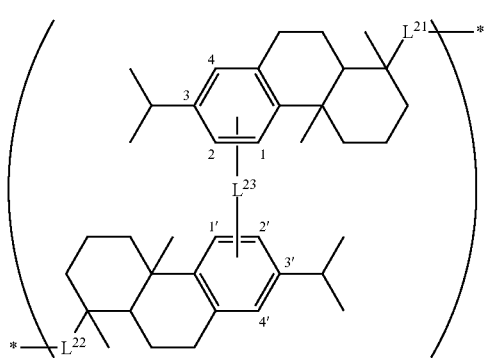

Formula (A2)

herein $L^{11}$, $L^{12}$, $L^{21}$, $L^{22}$ and $L^{23}$ each represent a divalent linking group; and

* represents a single bond.

4. The electrophotographic photoreceptor according to claim 3, wherein in the general formula (A1), $L^{11}$ is bonded to the carbon atom shown at the 2-position in the formula.

5. The electrophotographic photoreceptor according to claim 3, wherein in the general formula (A2), $L^{23}$ is bonded to the carbon atoms shown at the 2-position and the 2'-position in the formula.

6. The electrophotographic photoreceptor according to claim 3, wherein $L^{11}$ in the general formula (A1) represents *-$L^{13}$-CO-** or *-CO-$L^{13}$-**;

symbol * represents a single bond on the hydrophenanthrene ring side;

symbol ** represents a single bond on the opposite side of the single bond represented by symbol *;

$L^{13}$ represents at least one of an alkylene group, an alkenylene group, an alkynylene group, an arylene group, an oxygen atom, a carbonyl group, and a single bond; and $L^{12}$ represents a carbonyl group or a carbonyloxy group.

7. The electrophotographic photoreceptor according to claim 3, wherein $L^{21}$ and $L^{22}$ in the general formula (A2) each represent a carbonyl group or a carbonyloxy group; and $L^{23}$ represents an oxygen atom, a sulfur atom, a carbonyl group, a sulfonyl group, an alkylene group, an alkenylene group, an arylene group or a single bond.

8. The electrophotographic photoreceptor according to claim 3, wherein the polymer includes a repeating unit derived from a diol compound containing a ring structure.

9. The electrophotographic photoreceptor according to claim 8, wherein the repeating unit derived from a diol compound containing a ring structure is represented by the following general formula (B1):

[Chem. 3]

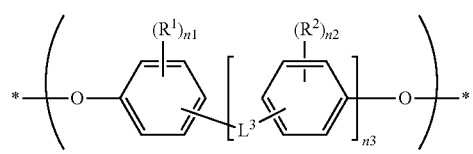

Formula (B1)

herein $L^3$ represents an oxygen atom, a carbonyl group, a sulfonyl group, an alkylene group or a single bond; when there are plural $L^3$'s, the respective $L^3$'s may be identical or different;

$R^1$ and $R^2$ each independently represent a halogen atom, an alky group or an alkoxy group, or may be bonded to each other and form a ring; when there are plural $R^1$'s and $R^2$'s, the respective $R^1$'s and $R^2$'s may be identical or different;

n1 and n2 each independently represent an integer of 0 to 4;

n3 represents an integer of 0 to 2; and

* represents a single bond.

10. The electrophotographic photoreceptor according to claim 1, wherein the polymer includes a repeating unit derived from a diol compound containing a ring structure.

11. The electrophotographic photoreceptor according to claim 10, wherein the repeating unit derived from a diol compound containing a ring structure is represented by the following general formula (B1):

[Chem. 3]

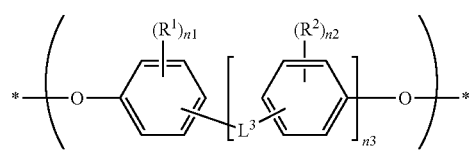

Formula (B1)

herein $L^3$ represents an oxygen atom, a carbonyl group, a sulfonyl group, an alkylene group or a single bond; when there are plural $L^3$'s, the respective $L^3$'s may be identical or different;

$R^1$ and $R^2$ each independently represent a halogen atom, an alky group or an alkoxy group, or may be bonded to each other and form a ring; when there are plural $R^1$'s and $R^2$'s, the respective $R^1$'s and $R^2$'s may be identical or different;

n1 and n2 each independently represent an integer of 0 to 4;

n3 represents an integer of 0 to 2; and

* represents a single bond.

12. The electrophotographic photoreceptor according to claim 1, wherein the degree of plant derivation of the binder resin is 25% by mass or more.

13. The electrophotographic photoreceptor according to claim 1, wherein the conductive support is a cylindrically shaped transparent support, and includes, along an outer circumference of the support, a charge generating layer and a charge transporting layer as the photosensitive layer.

14. The electrophotographic photoreceptor according to claim 1, wherein the photosensitive layer contains a binder resin, and a charge generating agent or a charge transporting agent.

15. A copying machine comprising the electrophotographic photoreceptor according to claim 1.

16. A dope for forming a photosensitive layer that is provided on a conductive substrate in an electrophotographic photoreceptor, wherein the dope includes a charge generating agent incorporated in a binder resin wherein the binder resin includes a polymer having a skeleton derived from dehydroabietic acid in a repeating unit.

* * * * *